(12) United States Patent
Lee et al.

(10) Patent No.: US 9,054,304 B2
(45) Date of Patent: Jun. 9, 2015

(54) RESISTIVE MEMORY DEVICE CAPABLE OF PREVENTING DISTURBANCE AND METHOD FOR MANUFACTURING THE SAME

(71) Applicant: SK hynix Inc., Icheon-si (KR)

(72) Inventors: Seung Yun Lee, Icheon-si (KR); Hae Chan Park, Icheon-si (KR); Myoung Sub Kim, Icheon-si (KR); Sung Bin Hong, Icheon-si (KR); Se Ho Lee, Icheon-si (KR); Jung Won Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 113 days.

(21) Appl. No.: 13/791,468

(22) Filed: Mar. 8, 2013

(65) Prior Publication Data

US 2014/0054537 A1 Feb. 27, 2014

(30) Foreign Application Priority Data

Aug. 24, 2012 (KR) ........................ 10-2012-0093232

(51) Int. Cl.
*H01L 21/20* (2006.01)
*H01L 45/00* (2006.01)
*H01L 27/24* (2006.01)

(52) U.S. Cl.
CPC ............ *H01L 45/1253* (2013.01); *H01L 45/16* (2013.01); *H01L 45/06* (2013.01); *H01L 45/1233* (2013.01); *H01L 45/1293* (2013.01); *H01L 45/1683* (2013.01); *H01L 27/2409* (2013.01)

(58) Field of Classification Search
USPC ............................................... 257/4; 438/382
See application file for complete search history.

(56) References Cited

U.S. PATENT DOCUMENTS

2009/0101883 A1* 4/2009 Lai et al. ........................ 257/3

FOREIGN PATENT DOCUMENTS

KR 1020120007838 A 1/2012
KR 1020120048991 A 5/2012

* cited by examiner

*Primary Examiner* — Marvin Payen
(74) *Attorney, Agent, or Firm* — Kilpatrick Townsend & Stockton LLP

(57) ABSTRACT

A resistive memory device capable of preventing disturbance is provided. The resistive memory device includes a lower electrode formed on a semiconductor substrate, a variable resistor disposed on the lower electrode, an upper electrode disposed on the variable resistor, and an interlayer insulating layer configured to insulate the variable resistor. The interlayer insulating layer may include an air-gap area in at least a portion thereof.

11 Claims, 8 Drawing Sheets

RESISTIVE MEMORY DEVICE CAPABLE OF PREVENTING DISTURBANCE AND METHOD FOR MANUFACTURING THE SAME

CROSS-REFERENCES TO RELATED APPLICATION

This application claims priority under 35 U.S.C. 119(a) to Korean patent application number 10-2012-0093232, filed on Aug. 24, 2012, in the Korean Patent Office, which is incorporated by reference in its entirety.

BACKGROUND OF THE INVENTION

1. Technical Field

The inventive concept relates to a semiconductor integrated circuit device and a method for manufacturing the same, and more particularly, to a resistive memory device and a method for manufacturing the same.

2. Related Art

Non-volatile memory devices retains data stored therein even when power shuts down and thus, the non-volatile memory devices have been widely applied to computers, mobile telecommunication systems, memory cards, and the like Flash memory devices which are representative as non-volatile memory devices have been widely used. The flash memory devices mainly apply memory cells having a stacked gate structure. The flash memory devices have to improve film quality of a tunnel oxide and a coupling ratio of a cell to improve reliability and program efficiency of a flash memory cell.

Currently, new non-volatile memory devices, for example, phase-change memory devices have been suggested other than the flash memory devices. In the phase-change memory devices, a unit cell includes a switching device connected at an intersection between a word line and a bit line arranged to be crossed each other and a data storage element connected to the switching device in series. The data storage element includes a lower electrode electrically connected to the switching device, a phase-change material pattern on the lower electrode, and an upper electrode on the phase-change material pattern. In general, the lower electrode serves as a heater.

In the phase-change memory devices, when a write current flows through the switching device and the lower electrode, Joule heat is generated in an interface between the phase-change material pattern and the lower electrode. The Joule heat changes the phase-change material pattern into an amorphous state (a high-resistance state or a reset state) or a crystalline state (a low-resistance state or a set state).

The phase-change material pattern is generally patterned to overlap the bit line. Thus, thermal disturbance is caused between phase-change material patterns adjacent on the same bit line.

In particular, when a space between cells is narrower with high integration of semiconductor devices, the thermal disturbance is more serious.

For example, in FIG. 1, when a cell A is in a high-resistance state which is a reset state and data "1" which is a high-resistance state is written in a cell B adjacent to the cell A, Joule heat is generated in the interface between a lower electrode 10 of the cell B and a phase-change material layer 20 to melt the phase-change material layer. At this time, since a phase-change material layer of the adjacent cell A is connected to the phase-change material layer of the cell B, the heat is conducted to the cell A and a temperature of the conducted region is increased. Therefore, the crystallization is progressed in a "1" state of a high-resistance state and thus resistance is reduced. Accordingly, the cell A of "1" state losses an original data value to loss a role as a storage cell.

The thermal disturbance is a troublesome problem in the high integration phase-change memory devices and various methods such as a confined structure of a phase-change material pattern have been suggested. However, it is difficult to remove disturbance between memory cells arranged in the same bit line. In particular, when a memory cell operating in a reset state and a memory cell adjacent thereto, which are arranged on the same bit line, become in a set state, malfunction is caused by an effect of the disturbance.

SUMMARY

According to one aspect of an exemplary embodiment, there is provided a resistive memory device. The resistive memory device may include: a lower electrode formed on a semiconductor substrate; a variable resistor disposed on the lower electrode; an upper electrode disposed on the variable resistor; and an interlayer insulating layer configured to insulate the variable resistor. The interlayer insulating layer may include an air-gap area in at least a portion thereof.

According to another aspect of an exemplary embodiment, there is provided a resistive memory device. The resistive memory device may include: a lower electrode formed on a semiconductor substrate; a first variable resistor disposed on the lower electrode; a spacer surrounding an outer circumference of the first variable resistor; an upper electrode disposed on the first variable resistor; and an air-gap area configured to insulate the first variable resistor. In some embodiments, the resistive memory device also includes a second variable resistor between a second lower electrode and a second upper electrode, wherein the air gap is disposed between the first and the second variable resistors.

According to another aspect of an exemplary embodiment, there is provided a method for manufacturing a resistive memory device. The method may include: forming a lower electrode on a semiconductor substrate; forming an interlayer insulating layer having a variable resistor region to expose the lower electrode; forming a first spacer on a sidewall of the variable resistor region; forming a second spacer on a sidewall of the first spacer; forming a variable resistor in the variable resistor region defined the second spacer; removing the first spacer to form an air-gap area; and forming an upper electrode on the variable resistor.

According to another aspect of an exemplary embodiment, there is provided a method for manufacturing a resistive memory device. The method may include: forming a lower electrode on a semiconductor substrate; forming an interlayer insulating layer having a variable resistor region to expose the lower electrode; forming a first spacer on a sidewall of the variable resistor region; forming a second spacer on a sidewall of the first spacer; forming a variable resistor in the variable resistor region defined by the second spacer; forming an upper electrode on the variable resistor; recessing the expose interlayer insulating layer by a predetermined thickness using the upper electrode as a mask; and removing at least one of the first spacer and the interlayer insulating layer to form an air-gap area.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
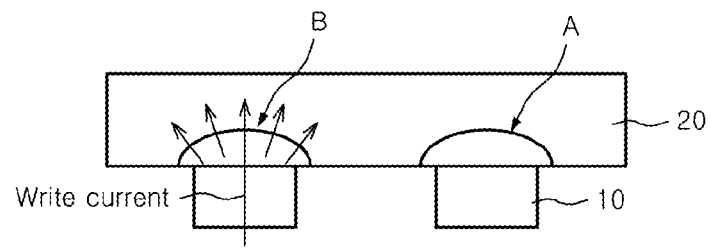
FIG. 1 is a view explaining disturbance of a general resistive memory device.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 2A to 2E are cross-sectional views illustrating a method for manufacturing a resistive memory device according to an exemplary embodiment.

Figure 2A:
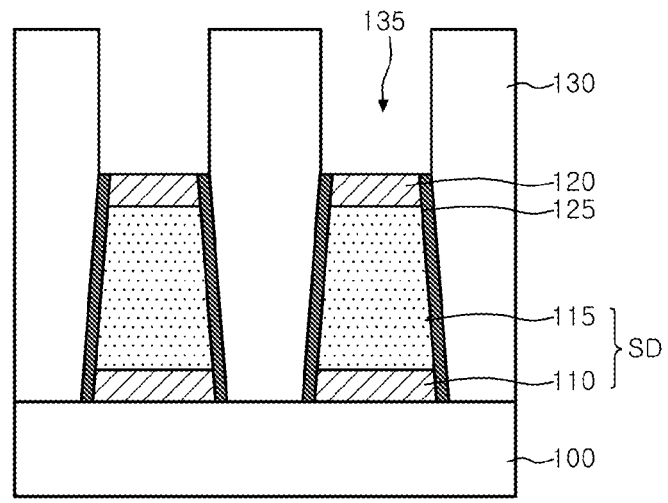
FIGS. 2A to 2E are cross-sectional views illustrating a method for manufacturing a resistive memory device according to an exemplary embodiment of the inventive concept.

Referring to FIG. 2A, a barrier layer 110, a diode material layer 115, and a lower electrode layer are sequentially deposited on a semiconductor substrate 100. Next, portions of the lower electrode layer, the diode material layer 115, and the barrier layer 110 are patterned to form a shottky diode SD and a lower electrode 120 on the shottky diode SD. A protection spacer 125 may be formed on sidewalls of the shottky diode SD and the lower electrode 120 to protect the sidewall of the shottky diode SD. The protection spacer 125 may include, for example, a silicon nitride layer. A first interlayer insulating layer 130 is formed to insulate between shottky diodes. The first interlayer insulating layer 130 may be configured of a single layer or a plurality of layers. When the first interlayer insulating layer 130 is formed of the single layer, the first interlayer insulating layer 130 may be formed to have a thickness larger than a height of the shottky diode SD by a predetermined thickness. Further, when the first interlayer insulating layer 130 is formed of the plurality of layers, the first interlayer insulating layer 130 may be formed by depositing an insulating layer plural times so that the first interlayer insulating layer 130 has a thickness larger than a height (or a thickness) of the shottky diode SD above a predetermined thickness. Next, a portion of the first interlayer insulating layer 130 is etched to expose the lower electrode 120 and thus a variable resistor region 135 is defined. In the exemplary embodiment, a width of the variable resistor region 135 may be substantially the same as that of the shottky diode SD.

Figure 2B:
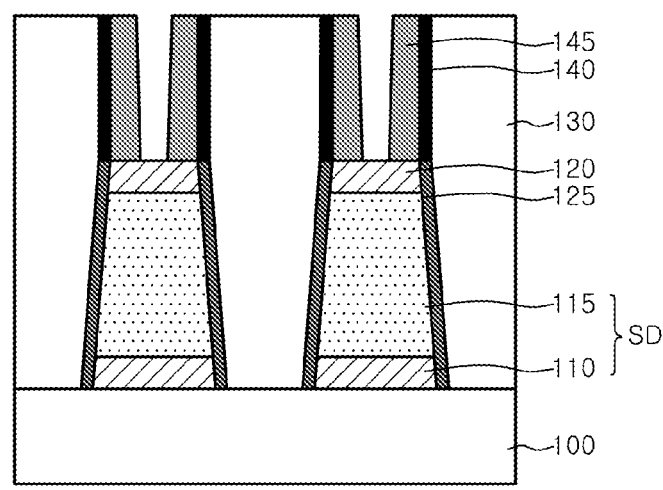

Referring to FIG. 2B, a first spacer 140 and a second spacer 145 are formed on a sidewall of the variable resistor region 135. The first spacer 140 may be formed on the sidewall of the variable resistor region 135 and the second spacer 145 may be formed on a sidewall of the first spacer 140. The first spacer 140 may be formed of a material having a different etch selectivity from the second spacer 145 and the first interlayer insulating layer 130 and the first spacer 140 may have the same width as the second spacer 145 or have a different width from the second spacer. A critical dimension (CD) of the first spacer 140 may be narrower than that of the second spacer 145. In the exemplary embodiment, the first interlayer insulating layer 130 may include a silicon oxide layer, the first spacer 140 may include a silicon nitride layer, and the second spacer 145 may include a silicon oxide layer so that an oxide-nitride-oxide (ONO) structure may be used.

Figure 2C:
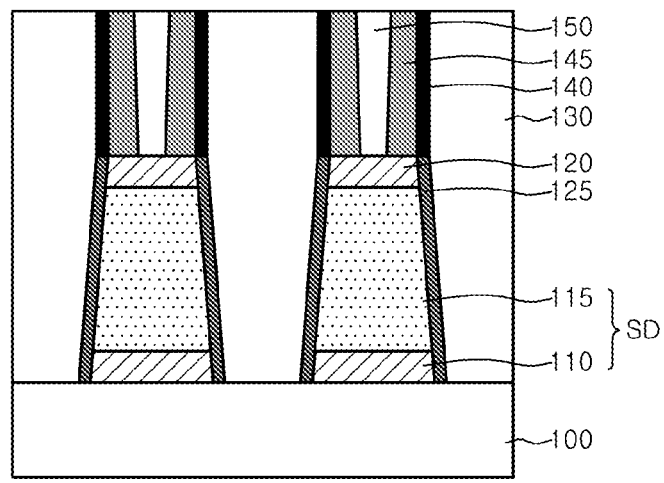

Referring to FIG. 2C, a variable resistive material is deposited to be filled within a space surrounded by the second spacer 145 and planarized to expose a surface of the first interlayer insulating layer 130. Therefore, a variable resistor 150 is formed. The variable resistor 150 may includes a PCMO layer as a resistive memory material, a chalcogenide layer as a phase-change memory material, a magnetic layer as a magnetic memory material, a magnetization switching layer as a spin transfer torque memory random access memory (STTMRAM) material, or a polymer layer as a polymer memory material.

Figure 2D:
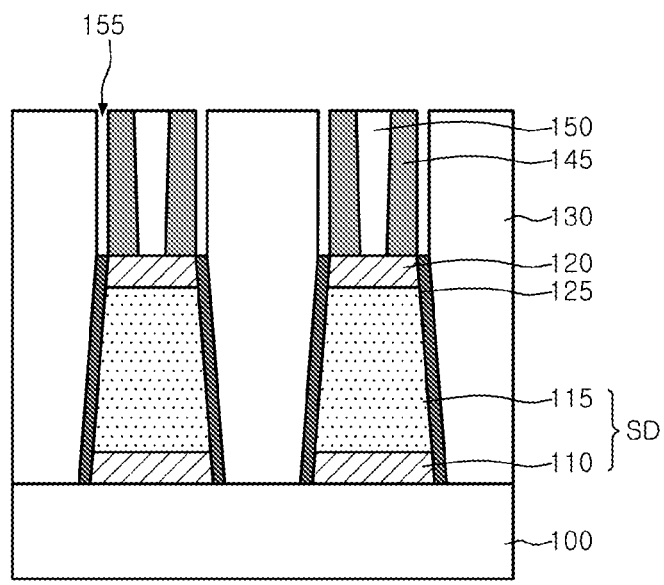

Referring to FIG. 2D, the exposed first spacer 140 is selectively removed to form an air-gap area 155. As well known, the air-gap, that is, air has a very low thermal conductivity of 0.0267 W/mK. Therefore, when data "1" of a high-resistance state is written in a memory cell, transfer of generated Joule heat to a phase-change material layer of an adjacent memory cell can be extremely reduced. Therefore, disturbance can be fundamentally suppressed.

Figure 2E:
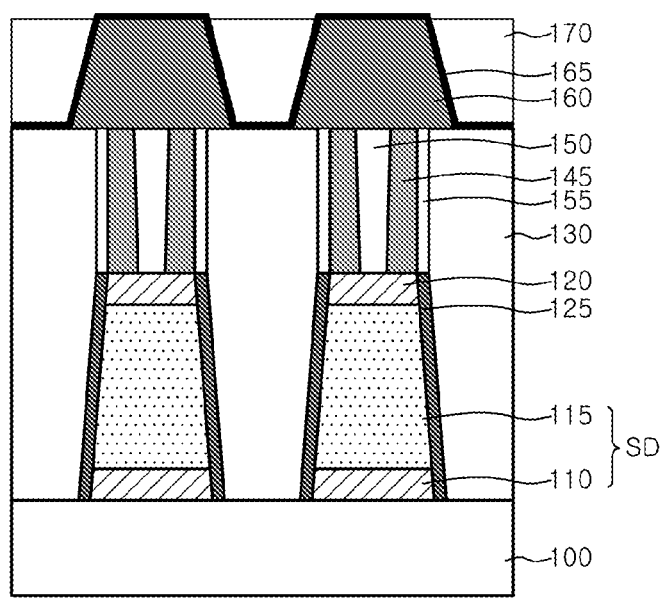

Referring to FIG. 2E, a metal layer is deposited on the first interlayer insulating layer 130 in which the air-gap area 155 is formed and then patterned to remain on the variable resistor 150 and an upper electrode 160 is formed. At this time, the air-gap area 155 is formed to have a width so that the metal layer is not infiltrated into the air-gap area 155 when the metal layer is deposited to form the upper electrode 160. An encapsulation dielectric layer 165 is formed on surfaces of the first interlayer insulating layer 130 and the upper electrode 160. The encapsulation dielectric layer 165 may be conformally deposited on the surfaces of the first interlayer insulating layer 130 and the upper electrode 160. A second interlayer insulating layer 170 is deposited on the encapsulation dielectric layer 165 and then planarized until a surface of the encapsulation dielectric layer 165 is exposed.

According to the exemplary embodiment, the air-gap area having low thermal conductivity is formed on a sidewall portion of the variable resistor 150 to reduce the disturbance.

Figure 3A:
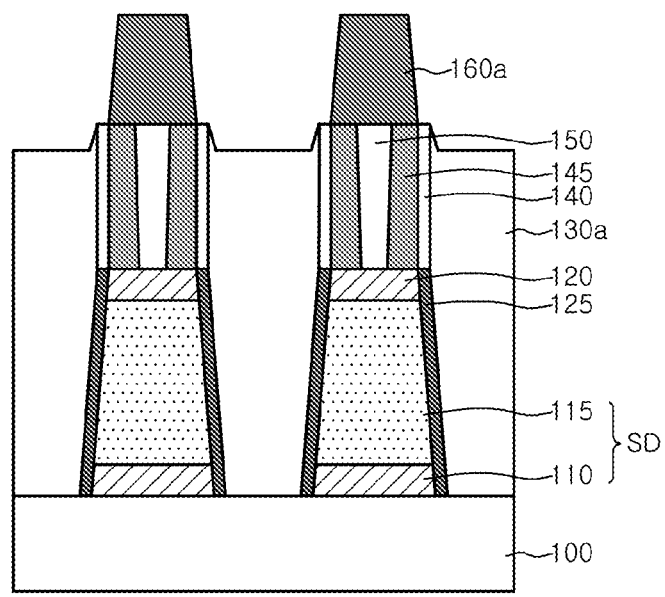
FIGS. 3A to 3C are cross-sectional views illustrating a method for manufacturing a resistive memory device according to another exemplary embodiment of the inventive concept.
Figure 3B:
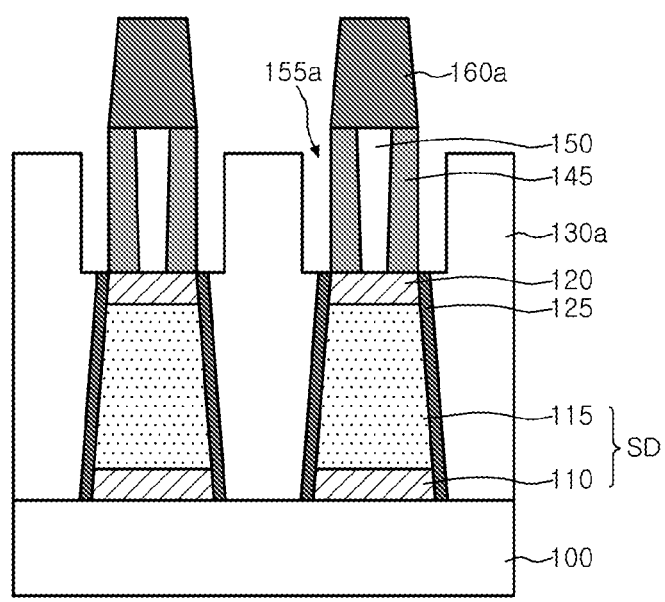
Figure 3C:
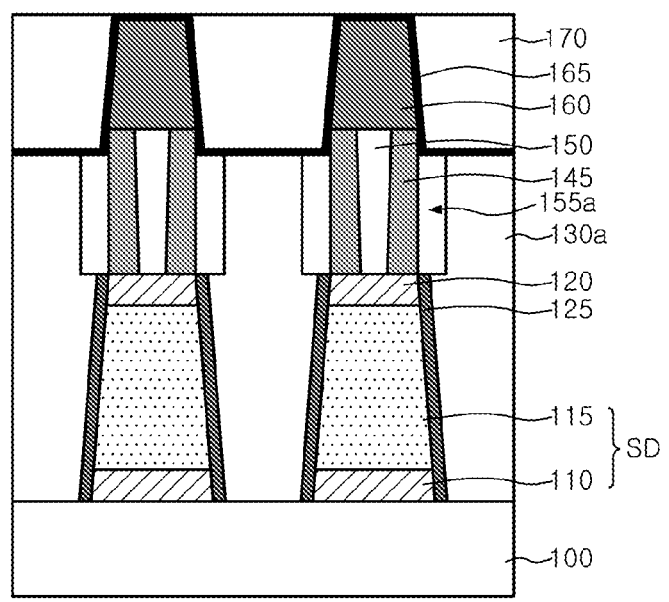

FIGS. 3A to 3C are cross-sectional views illustrating a method for manufacturing a resistive memory device according to anther exemplary embodiment of the inventive concept. The processes until the variable resistor is formed are the same as the processes of FIGS. 2A to 2C and thus repetitive description thereof will be omitted. Hereinafter, the process subsequent to the process of FIG. 2C will be described in more detail.

Referring to FIG. 3A, a metal layer is deposited on the first interlayer insulating layer (see 130 of FIG. 2C) in which a variable resistor 150 is formed and then patterned to cover the variable resistor 150 and a second spacer 145. Therefore, an upper electrode 160a is formed and a first spacer 140 is exposed by the upper electrode 160a. Next, the exposed first interlayer insulating layer 130 is recessed by a predetermined thickness using the upper electrode 160a as a mask. The first interlayer insulating layer 130 becomes a recessed first interlayer insulating layer 130a.

Referring to FIG. 3B, the exposed first spacer 140 is removed using a conventional method to form an air-gap area 155a. For example, the first spacer 140 may be removed through a dipping process using an etchant which can selectively etch a material for the first spacer. Further, the first spacer 140 may be overetched to remove the first spacer 140 and a portion of the first interlayer insulating layer 130a adjacent to the first spacer 140 so that a width of the air-gap area 155a may be increased. Therefore, the width of the air-gap area 155a may be larger than that of the first spacer 140.

Referring to FIG. 3C, an encapsulation dielectric layer 165 is formed on a semiconductor substrate including the air-gap area 155a and a second interlayer insulating layer 170 is formed on the encapsulation dielectric layer 165. The width of the air-gap area 155a may be determined so that the encapsulation dielectric layer 165 is not infiltrated into the air-gap area 155a when the encapsulation dielectric layer is formed.

As in the above-described exemplary embodiment, the air-gap area 155a may be formed after the upper electrode 160a is formed.

FIGS. 4A to 4D are cross-sectional views illustrating a method for manufacturing a resistive memory device according to still another exemplary embodiment of the inventive concept.

Figure 4A:
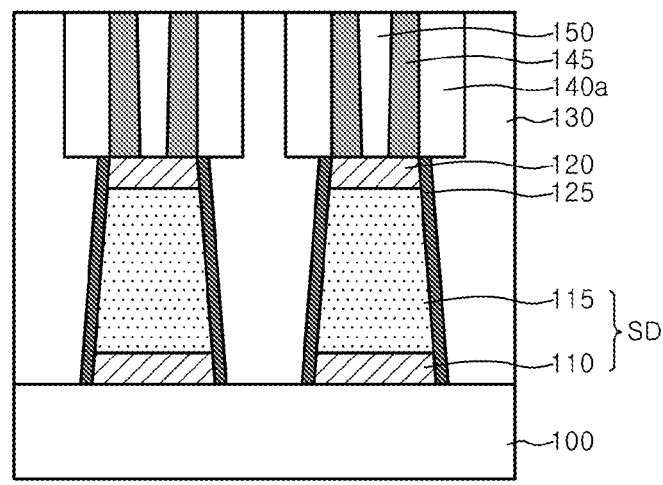
FIGS. 4A to 4D are cross-sectional views illustrating a method for manufacturing a resistive memory device according to still another exemplary embodiment of the inventive concept.

Referring to FIG. 4A, a shottky diode SD, a lower electrode 120, and a protection spacer 125 are formed on a semiconductor substrate 100 through the same method as described in the above-described exemplary embodiments. A first interlayer insulating layer 130 is formed on the semiconductor substrate on which the shottky diode SD, the lower electrode 120, and the protection spacer 125 are formed. The first interlayer insulating layer 130 is etched to expose the shottky diode SD and a portion of the first interlayer insulating layer 130 adjacent to the shottky diode SD and therefore, a variable resistor region (not shown) is defined. At this time, the variable resistive region may have a width larger than that of the shottky diode SD.

A first spacer 140a and a second spacer 145 are sequentially formed on a sidewall of the variable resistor region through a conventional method. In the exemplary embodiment, the first spacer 140a has to be formed of the same material as the first interlayer insulating layer 130. Next, a variable resistor 150 is formed in a space of the variable resistor region surrounded by the second spacer 145.

Figure 4B:
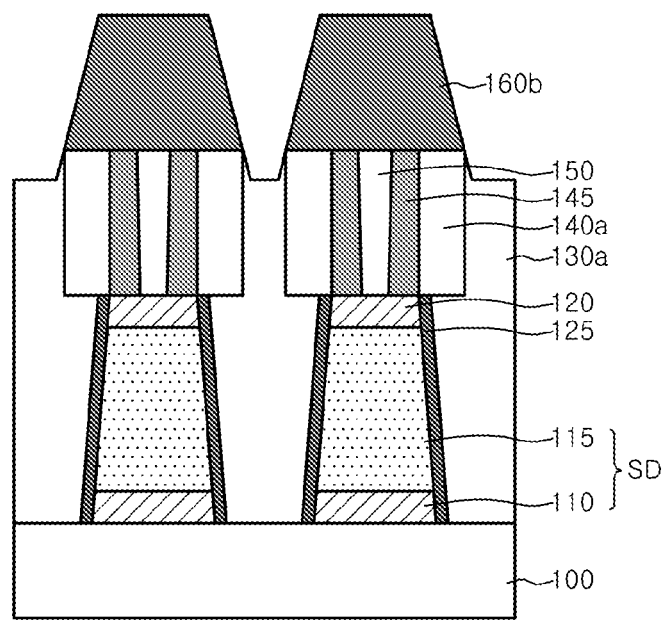

Referring to FIG. 4B, an upper electrode 160b is formed on the variable resistor 150, the second spacer 145, and the first spacer 140a through a conventional method. Next, the exposed first interlayer insulating layer 130 is recessed by a predetermined thickness using the upper electrode 160b as a mask. Therefore, the first interlayer insulating layer 130 becomes a recessed first interlayer insulating layer 130a.

Figure 4C:
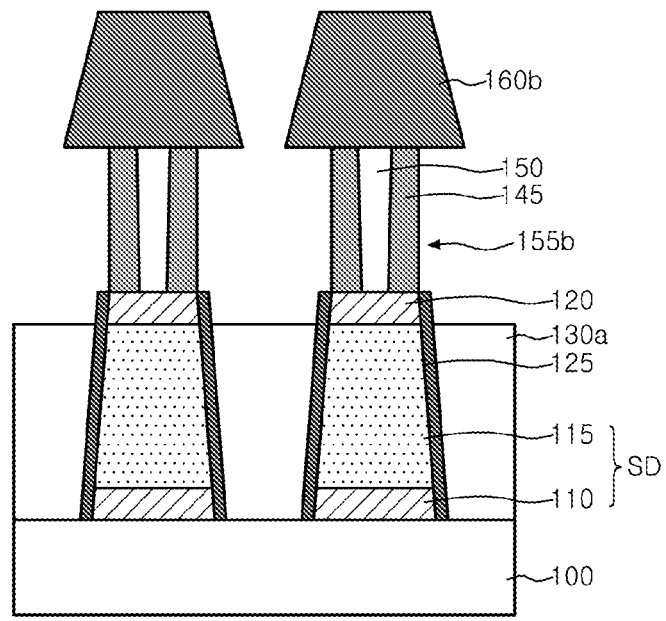

Referring to FIG. 4C, the recessed first interlayer insulating layer 130a and the first spacer 140a having the same etch selectivity as the recessed first interlayer insulating layer 130a are removed to form an air-gap area 155b. Since the recessed first interlayer insulating layer 130a and the first spacer 140a are formed of the same material, the recessed first interlayer insulating layer 130a and the first spacer 140a may be removed by dipping the semiconductor substrate including the upper electrode 160b into an etchant which can selectively remove the first interlayer insulating layer 130a and the first spacer 140a. At this time, the first interlayer insulating layer 130a is partially removed to form the air-gap area 155b.

Figure 4D:
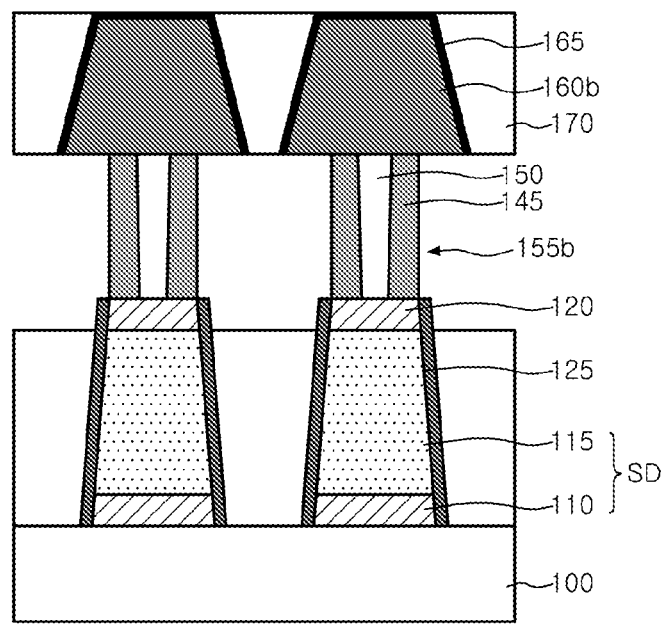

Referring to FIG. 4D, an encapsulation dielectric layer 165 is formed on the semiconductor substrate including the air-gap area 155b and a second interlayer insulating layer 170 is formed on the encapsulation dielectric layer 165. At this time, the second interlayer insulating layer 170 may be formed of a plurality of layers so that the second interlayer insulating layer 170 is not filled within the air-gap area 155b. That is, a first layer for the second interlayer insulating layer 170 is formed of a thin film so that an opened seam is intentionally formed in a space between adjacent upper electrodes 160b and a second layer for the second interlayer insulating layer 170 is deposited within the seam. Therefore, the second interlayer insulating layer 170 is formed.

In the exemplary embodiment, an interlayer insulating layer itself is removed and thus an air-gap is formed in a space from which the interlayer insulating layer is removed. Therefore, the air-gap having low thermal conductivity is used as an interlayer insulating layer to reduce occurrence of the disturbance.

As described above, according to exemplary embodiments, an air-gap area is formed in at least a portion between variable resistors. Therefore, an air-gap material having lower thermal conductivity than a general insulating layer is provided in an interlayer insulating layer and thus disturbance can be reduced.

The above embodiment of the present invention is illustrative and not limiting. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A resistive memory device, comprising:
   a lower electrode formed on a semiconductor substrate;
   a first variable resistor disposed on the lower electrode;
   a spacer surrounding an outer circumference of the variable resistor;
   an upper electrode disposed on the variable resistor; and
   an air-gap area adjacent to the first variable resistor and configured to insulate the first variable resistor,
   wherein the upper electrode does not cover a top portion of the air gap.

2. The resistive memory device of claim 1, further comprising a second variable resistor between a second lower electrode and a second upper electrode, wherein the air gap is disposed between the first and the second variable resistors.

3. The resistive memory device of claim 1, further comprising a dielectric layer that overlies the air gap.

4. The resistive memory device of claim 3, further comprising an encapsulation dielectric layer that covers the upper electrode covers a top portion of the air gap.

5. A method for manufacturing a resistive memory device, the method comprising:
   forming a lower electrode on a semiconductor substrate;
   forming an interlayer insulating layer having a variable resistor region to expose the lower electrode;
   forming a first spacer on a sidewall of the variable resistor region;
   forming a second spacer on a sidewall of the first spacer;
   forming a variable resistor in the variable resistor region defined the second spacer;
   removing the first spacer to form an air-gap area; and
   forming an upper electrode on the variable resistor.

6. The method of claim 5, wherein the upper electrode is formed to cover the second spacer, the air-gap area, and a portion of the interlayer insulating layer at an outer side of the air-gap area.

7. The method of claim 5, wherein the first spacer includes a material having etch selectivity different from the second spacer and the interlayer insulating layer.

8. A method for manufacturing a resistive memory device, the method comprising:
   forming a lower electrode on a semiconductor substrate;
   forming an interlayer insulating layer having a variable resistor region to expose the lower electrode;
   forming a first spacer on a sidewall of the variable resistor region;
   forming a second spacer on a sidewall of the first spacer;
   forming a variable resistor in the variable resistor region defined by the second spacer;
   forming an upper electrode on the variable resistor;
   recessing the expose interlayer insulating layer by a predetermined thickness using the upper electrode as a mask; and
   removing at least one of the first spacer and the interlayer insulating layer to form an air-gap area.

9. The method of claim 8, wherein the upper electrode is formed on the variable resistor, the second spacer, and the first spacer.

10. The method of claim 8, wherein the first spacer includes a material having etch selectivity different from the second spacer and the interlayer insulating layer.

11. The method of claim 8, wherein the first spacer includes a material having the same etch selectivity as the interlayer insulating layer.

* * * * *